US010622193B2

(12) United States Patent
Burgess et al.

(10) Patent No.: US 10,622,193 B2
(45) Date of Patent: Apr. 14, 2020

(54) PLASMA ETCHING APPARATUS

(71) Applicant: SPTS TECHNOLOGIES LIMITED, Newport (GB)

(72) Inventors: Stephen R Burgess, Gwent (GB); Anthony Paul Wilby, Bristol (GB)

(73) Assignee: SPTS Technologies Limited, Newport (GB)

( * ) Notice: Subject to any disclaimer, the term of this patent is extended or adjusted under 35 U.S.C. 154(b) by 347 days.

(21) Appl. No.: 14/951,009

(22) Filed: Nov. 24, 2015

(65) Prior Publication Data

US 2016/0148787 A1 May 26, 2016

(30) Foreign Application Priority Data

Nov. 25, 2014 (GB) .................................. 1420935.7

(51) Int. Cl.
*H01J 37/32* (2006.01)
*C23C 14/04* (2006.01)
*H01J 37/34* (2006.01)
*C23C 14/34* (2006.01)
*H01J 37/18* (2006.01)

(52) U.S. Cl.
CPC ...... *H01J 37/32467* (2013.01); *C23C 14/046* (2013.01); *C23C 14/34* (2013.01); *H01J 37/18* (2013.01); *H01J 37/321* (2013.01); *H01J 37/32862* (2013.01); *H01J 37/34* (2013.01)

(58) Field of Classification Search
CPC ............. H01J 37/3438; H01J 37/32899; H01J 37/32587; H01J 37/18; H01J 37/321; H01J 37/32467; H01J 37/32477; H01J 37/32862; H01J 37/34; H01J 2237/022

USPC ..... 204/298.06, 298.08, 298.31; 156/345.48, 156/345.49
See application file for complete search history.

(56) References Cited

U.S. PATENT DOCUMENTS

| | | | | |
|---|---|---|---|---|
| 5,178,739 A | * | 1/1993 | Barnes | ................. C23C 14/345 204/192.12 |
| 5,240,555 A | | 8/1993 | Kilburn | |
| 5,273,609 A | * | 12/1993 | Moslehi | ................. C23C 16/52 118/722 |

(Continued)

FOREIGN PATENT DOCUMENTS

| | | |
|---|---|---|
| EP | 0822582 A2 | 2/1998 |
| EP | 1336984 A2 | 8/2003 |

(Continued)

OTHER PUBLICATIONS

"Matching an RF Sheath Model to a Bulk Plasma Model", IEEE Transactions on Plasma Science, IEEE Service Centre, Piscataway, NJ, US, vol. 23, No. 4, Aug. 1, 1995 (Aug. 1, 1995), pp. 717-727, XP000983862, ISSN: 0093-3813, DOI: 10.1109/27.467994.

*Primary Examiner* — Rodney G McDonald
(74) *Attorney, Agent, or Firm* — Hodgson Russ LLP (57) ABSTRACT

A plasma etching apparatus is for etching a substrate and includes at least one chamber, a substrate support positioned within the at least one chamber, and a plasma production device for producing a plasma for use in etching the substrate. The plasma production device comprises an electrically conductive coil which is positioned within the at least one chamber, and the coil is formed from a metallic material which can be sputtered onto an interior surface of the at least one chamber.

25 Claims, 4 Drawing Sheets

(56) References Cited

U.S. PATENT DOCUMENTS

| | | | |
|---|---|---|---|
| 5,384,018 A * | 1/1995 | Ramm | H01J 37/3402 118/723 HC |
| 5,961,793 A * | 10/1999 | Ngan | C23C 14/564 204/192.12 |
| 6,020,035 A | 2/2000 | Gupta et al. | |
| 6,350,353 B2 * | 2/2002 | Gopalraja | C23C 14/046 204/192.12 |
| 6,375,810 B2 * | 4/2002 | Hong | H01J 37/32082 204/192.12 |
| 6,428,663 B1 | 8/2002 | Mostovoy et al. | |
| 7,294,574 B2 | 11/2007 | Ding et al. | |
| 2010/0096255 A1 | 4/2010 | Ye et al. | |
| 2012/0241412 A1 | 9/2012 | Murakami | |
| 2013/0230971 A1 | 9/2013 | Geerpuram et al. | |
| 2013/0248358 A1 | 9/2013 | Weichart | |
| 2014/0034489 A1 * | 2/2014 | Kajihara | C23C 14/3464 204/298.11 |
| 2014/0196746 A1 | 7/2014 | Dinsmore et al. | |
| 2014/0361102 A1 | 12/2014 | Hatoh et al. | |

FOREIGN PATENT DOCUMENTS

| | | |
|---|---|---|
| WO | WO9908308 A1 | 2/1999 |
| WO | WO2012045187 A2 | 4/2012 |

* cited by examiner

Figure 4

PLASMA ETCHING APPARATUS

BACKGROUND

This invention relates to a plasma etching apparatus and also to a method of cleaning a plasma etching apparatus.

Figure 1:
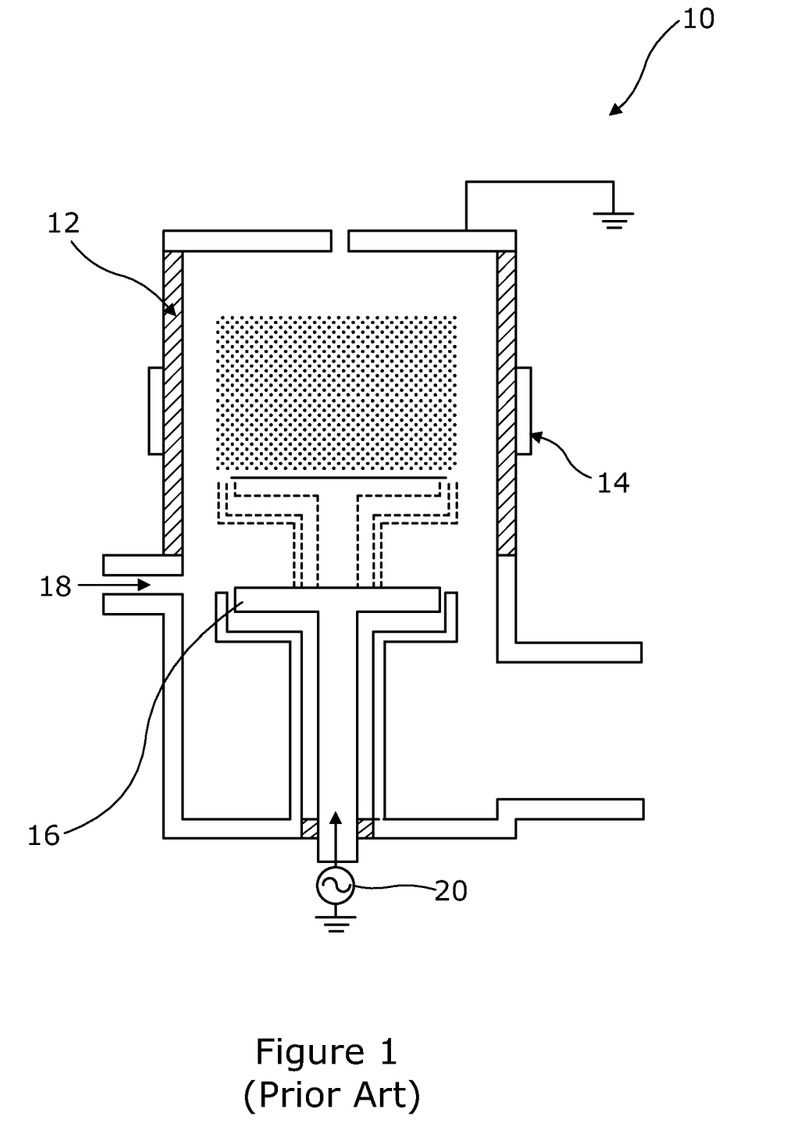
FIG. 1 is a cut away view of a prior art pre-clean module.

Plasma etching is widely used to process a variety of substrates, such as semiconductor wafers. The plasma etching process may be a step which forms part of a process sequence. For example, in the semiconductor industry it is well known to remove material from a wafer surface by a sputter etch process prior to a subsequent metal deposition step. The sputter etch process is typically performed using an Argon plasma. The purpose is to ensure a high quality metal/metal interface resulting in a low contact resistance. The sputter etch step is typically conducted in a pre-clean module. FIG. 1 shows an example of the prior art, pre-clean module 10 of this type. The pre-clean module 10 comprises a vacuum chamber 12 which is surrounded by an inductive coil 14. A workpiece (not shown) is supported inside the chamber 12 on a platen 16. The workpiece is introduced into the chamber 12 through a wafer loading slot 18. The platen 16 is in a lowered position (shown by solid lines in FIG. 1) to receive the workpiece which has been introduced through the wafer loading slot 18. The platen 16 is subsequently raised into the position shown by the dotted lines in FIG. 1 prior to commencement of the sputter etch process. The inductive coil 14 is connected to an RF power generator (not shown) through an impedance matching network (not shown) as is well known in the art. The pre-clean module further comprises an RF power generator 20 which is connected to the platen 16 through an associated impedance matching circuit (not shown).

The RF power generator 20 is used to bias the platen 16. The walls of the chamber 12 are made from an electrically insulating material such as quartz or ceramic in order to minimise attenuation of RF power coupled into the chamber 12. In operation, a gas (typically Argon) is introduced into the chamber 12 at a relatively low pressure (typically 1-10 mTorr) through a mass flow controller. RF power coupled via the coil 14 generates a plasma. The bias applied to the platen 16 is then used to accelerate ions from the plasma towards the wafer, where ion bombardment etches the surface of the workpiece.

The workpiece may contain substances which outgas heavily. Examples of such substances are organic passivation layers, adhesives, photoresists and spin-on materials. Additionally, novel substrate materials are increasingly being used that outgas heavily. Within the advanced wafer packaging industry, these materials can include polyimide (PI) and polybenzoxazole (PBO) which are especially problematic. When these materials outgas, contaminants are released into the process tool which raises the pressure in the chamber. This can cause significant problems in recovering acceptable vacuum levels in the chamber between the processing of successive workpieces.

There is an additional problem associated with prolonged or frequent etching of polymeric materials on a workpiece. This is the build up of carbonaceous material around the lid and walls of the chamber. The carbonaceous material can accumulate to a point where particulate material becomes loose. There is then a risk that the loose particulate material can fall onto the workpiece causing contamination. Additionally, these particulate materials release gaseous by-products which increase the base pressure of the chamber. This results in poor vacuum levels, and also results in associated problems with process control.

Another problem still is that the etching of any conductive layers can lead to a build up of conductive material on the chamber wall. This gives rise to a conductive coating which can attenuate RF power coupled into the chamber by the coil. As the conductive coating builds in thickness over time, the attenuation can increase to a point where the etch process is affected. For example, problems such as etch rate drift, etching uniformity, and problems with igniting or sustaining the plasma may occur.

The conventional solution to these problems is to perform a maintenance procedure on a frequent basis. This ultimately results in the chamber being vented to atmosphere so that a mechanical clean can be carried out. This intervention has a significant cost and tool downtime. This is not desirable in a production environment. Instead, it would be desirable to reduce the frequency of these maintenance interventions, to reduce cost whilst improving the uptime of the tool.

SUMMARY

The present invention, in at least some of its embodiments, addresses one or more of the above described problems. Although the invention is particularly suited to sputter etch processes, such as sputter etch processes conducted in a pre-clean module, the invention is not limited in this respect. Instead, the invention can be applied to a wide range of plasma etching processes.

According to a first aspect of the invention there as provided a plasma etching apparatus for etching a substrate comprising:

at least one chamber;

a substrate support positioned within the at least one chamber; and a plasma production device for producing a plasma for use in etching the substrate;

in which the plasma production device comprises an electrically conductive coil which is positioned within the at least one chamber, and the coil is formed from a metallic material which can be sputtered onto an interior surface of the at least one chamber.

In this way, one or more cleaning functions may be performed. This can reduce the frequency with which maintenance operations are required. This in turn can reduce running costs and improve the up time of the apparatus.

The metallic material may be a metal or a metal alloy.

The metallic material may be sputtered so as to adhere particulate material to an interior surface of the at least one chamber. This can reduce the likelihood of particulate material falling from the interior surface onto the substrate and thereby contaminating the substrate. Also, particulate materials may release unwanted gaseous by-products which increase the base pressure of the chamber and affect process control. By adhering particulate materials to an interior surface of the chamber, this problem can be at least reduced. The metallic material may be aluminium, an aluminium alloy, or copper.

The material may be a getter material. The getter material may be a material which removes one or more gaseous species present in the at least one chamber. The getter material may react with or absorb a gaseous species present in the at least one chamber. The getter material may be titanium, tantalum, or tungsten. In this way, the base pressure and pumping speed of the chamber can be improved.

The apparatus may further comprise a device for placing a cover over the substrate support during sputtering of the metallic material and removing the cover after said sputtering. The device for placing a cover may comprise said cover which is in connection with a moveable element housed within the at least one chamber. The device for placing a cover may be a moveable shutter.

Alternatively, the device for placing a cover may comprise a dummy substrate which is transported into and out of contact with the substrate support by a substrate transfer system. A wafer loading slot and an associated wafer transportation system may be used for this purpose.

The at least one chamber may comprise a lid which is electrically isolated from the remainder of the at least one chamber. The lid may be formed from a metallic material which can be sputtered from the lid onto an interior surface of the at least one chamber. The metallic material may be a metal or a metal alloy. The metallic material may be the same as or different to the metallic material of the electrically conductive element.

The metallic material of the lid may be sputtered so as to adhere particulate material onto an interior surface of the at least one chamber. The metallic material of the lid may be aluminium, an aluminium alloy, or copper. The metallic material of the lid may be a getter material. The metallic material of the lid may be titanium, tantalum or tungsten.

The apparatus may comprise a lid electrical power supply for supplying electrical power to the lid to enable sputtering of the metallic material from the lid. The lid electrical power supply may supply negative DC electrical power to the lid.

The apparatus may further comprise a switching device for switching the lid between an electrical connection with the lid electrical power supply and at least one other electrical state. The other electrical state may be a ground state or an electrically floating state.

The at least one chamber may comprise walls which are formed from an electrically conductive material. The at least one chamber may further comprise one or more wall liners. The wall liners may be also formed from an electrically conductive material. It is possible to use chambers of this type because the coil is positioned within the chamber. Power coupled into the chamber is not attenuated by any build-up of conductive material on the walls. Also, temperature fluctuations are reduced due to the relatively high thermal conductivity of the chamber walls. This can reduce the likelihood of material flaking off the walls. The electronically conductive material may be aluminium.

The apparatus may further comprise a controller which is operable to switch the apparatus between a first operational mode in which etching of a substrate is performed and a second operational mode in which metallic material is sputtered on to an interior surface of the at least one chamber. The second operational mode may be used to perform a cleaning function.

The metallic material may be sputtered from the electrically conductive element to perform the cleaning function.

The metallic material may be sputtered from the lid to perform the cleaning function.

The switching device may be configured so that the lid is in the at least one other electrical state during the first operational mode, and is in electrical connection with the lid electrical power supply during the second operational mode.

The plasma production device may be an inductively coupled plasma production device. The coil may be an inductive coil.

The apparatus may further comprise an RF electrical power supply for supplying an RF bias power to the substrate support.

Typically the plasma etching apparatus comprises a single chamber. However, multiple chamber apparatus are within the scope of the invention.

The plasma etching apparatus may be a sputter etch apparatus. The plasma etching apparatus may be an Argon sputter etch apparatus. The plasma etching apparatus may be a pre-clean module for use in a multi-processing tool.

The plasma production device may comprise an electrical generator, preferably an RF generator, which supplies electrical power to the coil. The plasma may be produced by inductive coupling of the electrical power supplied to the coil.

According to a second aspect of the invention there is provided a method of cleaning a plasma etching apparatus of the type used to etch a substrate and having at least one chamber, the method comprising the step of sputtering a metallic material from an electrically conductive coil which is positioned within the at least one chamber onto an interior surface of the at least one chamber to perform a cleaning function.

The step of sputtering a metallic material to perform a cleaning function may be performed after a step of etching the substrate. After the etching step and prior to the sputtering step, a cover may be placed over the substrate support. The cover may be removed after the sputtering step and prior to a subsequent etching step.

The metallic material may be sputtered so as to adhere particulate material to an interior surface of the at least one chamber.

The metallic material may be a getter material which removes gaseous species present in the at least one chamber. The getter material may react with or adsorb a gaseous species present in the at least one chamber.

The plasma etching apparatus may comprise a lid which is electrically isolated from the remainder of the at least one chamber. The method may further comprise sputtering a metallic material from the lid onto an interior surface of the at least one chamber to perform a cleaning function. The cleaning functions may be as described above.

The step of sputtering may be performed using a plasma. The plasma used during the sputtering step may be the same as or different to the plasma used to etch the substrate.

The step of sputtering may be performed using an Argon plasma.

The substrate may comprise a semiconductor material. The substrate may be a semiconductor wafer.

According to a third aspect of the invention there is provided a multi-processing tool for processing a workpiece comprising a plurality of processing modules, in which one of the modules is a pre-clean module comprising a plasma etching apparatus of the first aspect of the invention.

Whilst the invention has been described above, it extends to any inventive combination of the features set out above or in the following description, drawings or claims. For example, any feature described in relation to the first aspect of the invention is considered to be disclosed also in relation to the second aspect of the invention and vice versa.

BRIEF DESCRIPTION OF THE DRAWINGS

Embodiments of plasma etching apparatus in accordance with the invention will now be described with reference to the accompanying drawings, in which.

DETAILED DESCRIPTION OF EMBODIMENTS

Figure 2:
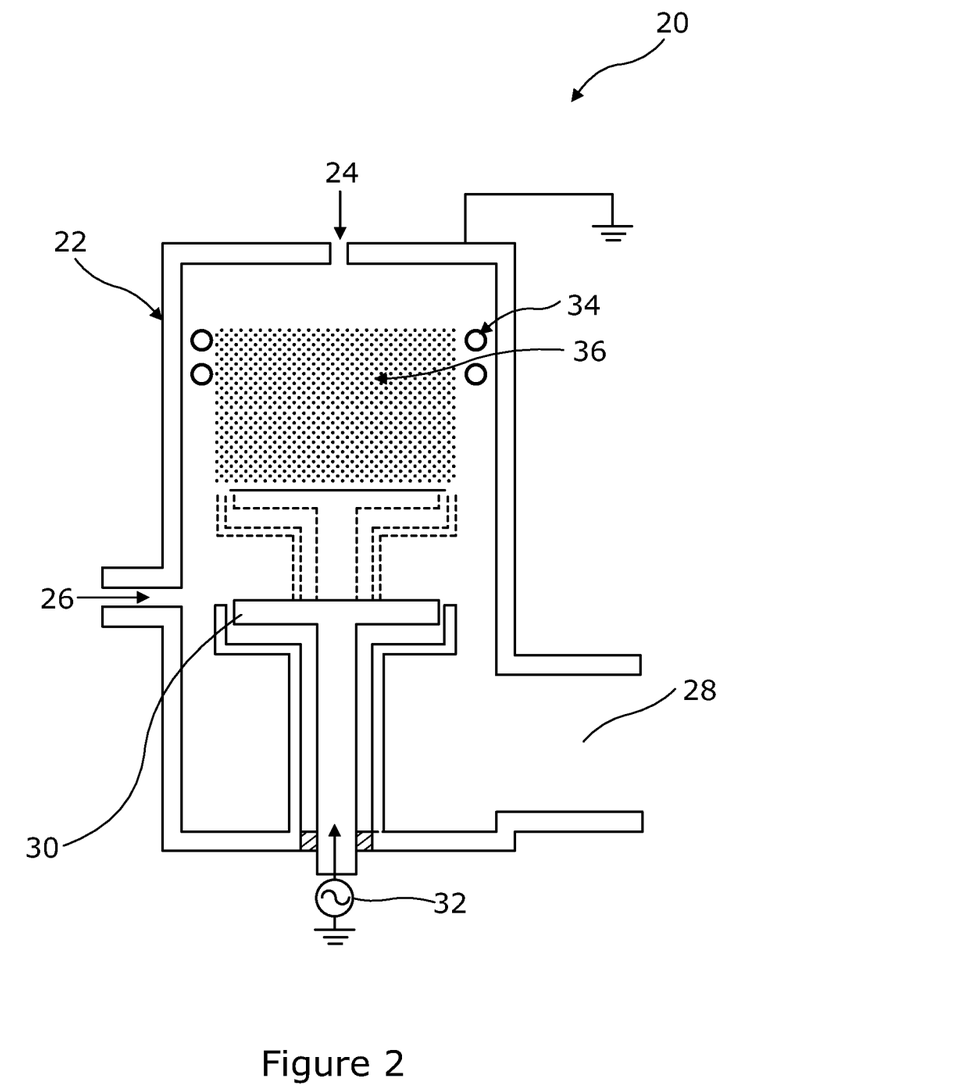
FIG. 2 is a cut away view of a first embodiment of a plasma etching apparatus.

FIG. 2 shows a first embodiment of a plasma etching apparatus of the invention, depicted generally at 20. The apparatus 20 comprises a chamber 22 having a suitable gas inlet 24 disposed in a top portion thereof. The chamber 22 further comprises a wafer loading slot 26, and a pumping port 28 which may be connected to a suitable pumping arrangement such as a vacuum line leading to a turbo molecular pump. The interior of the chamber 22 houses a platen 30 on which a workpiece such as a wafer may be loaded. The platen 30 as shown by solid lines in FIG. 2 is in a lowered position for receiving the workpiece. The platen 30 would then subsequently be raised into the position shown by the dotted lines in FIG. 2 prior to commencement of an etch process. An RF power supply 32 is provided which provides an RF bias power to the platen 30. For convenience, an RF signal frequency of 13.56 MHz is used, although in principle other frequencies might be employed. The chamber 22 further comprises an inductive coil 34, which in accordance with the present invention is positioned within the chamber 22. The inductive coil 34 is connected to an RF power generator (not shown). The connection to the RF power generator may be through an impedence matching network (not shown) as is well known in the art. A suitable process gas or gases are supplied to the chamber 22 through the gas inlet 24, and the power supplied to the internally positioned inductive coil 34 is used to produce a plasma 36 in the chamber 22. Advantageously, the chamber 22 and/or any removable shielding within the chamber 22 is formed from an electrically conductive material such as aluminium. In the embodiment shown in FIG. 2, the chamber 22 is electrically grounded.

The plasma 36 is used to perform plasma etching of a workpiece. The plasma 36 is also used in a sputtering step may be identical or non-identical to the plasma used to perform plasma etching of the workpiece.

The coil 34 is formed from a metallic material which may be sputtered. By appropriate control of the process gas or gases and the RF power supplied to the coil 34 and the platen 30, control of parameters such as ion density, ion energy and ion directionality can be achieved. In this way, metallic material from the coil 34 can be sputtered onto the walls of the chamber 22. The sputtered metallic material can perform one or more cleaning functions. In one embodiment, the coil is manufactured from a reactive metal such as titanium which acts as a getter material. Titanium is a very effective getter of CO and other gaseous by-products that are released by the etching of organic layers. Titanium can be sputtered from the coil 34 onto the walls of the chamber 22. Since titanium is very reactive, components of the residual gas in the chamber which collide with titanium on the chamber walls are likely to react with the titanium to form a stable, solid product. This reduces the gas pressure in the chamber. As a result, problems associated with poor vacuum performance and long pump-to-base recovery time can be significantly reduced. The coil may be formed from another getter material such as tantalum or tungsten. In another embodiment, the coil is formed from a material such as aluminium which exhibits low stress and good adhesion to the walls of the chamber. The material is sputtered from the coil onto the walls of the chamber. Any loose particulate material present on the walls of the chamber is effectively coated in place by the material sputtered from the coil. This results in a reduction in loose particulate material that might otherwise contaminate the workpiece. Instead of aluminium, an aluminium alloy or copper might be used. An additional advantage of aluminium or some aluminium alloys is that these materials can consume oxygen as well.

The position of the coil 34 within the chamber 22 gives rise to a further advantage. Because of this location of the coil, there is no need for the chamber to be fabricated from an insulating material. Instead, the chamber can be fabricated from a conductive material. Any shielding present within the chamber can also be fabricated from a conductive material. Typically, the conductive chamber walls are electrically grounded. Therefore, the chamber walls act as an anode for the platen 30 when the platen 30 is biased by RF power applied from the RF generator 32. Since the chamber walls are conductive, any conductive material which is deposited on the chamber walls has no detrimental effect on the plasma within the chamber. In addition, the thermal conductivity of the walls is greatly improved in comparison to prior art chambers formed from insulating materials. This reduces the extent of temperature fluctuations occurring during processing, which in turn reduces the tendency of re-deposited material to flake away from the walls of the chamber due to mismatches in thermal expansion coefficients. A further advantage is that it is possible to control the surface finish of metallic chamber components using techniques such as grit blasting or flame spraying. This can reduce particle levels by providing a rough surface that re-deposited material can adhere to.

Figure 3:
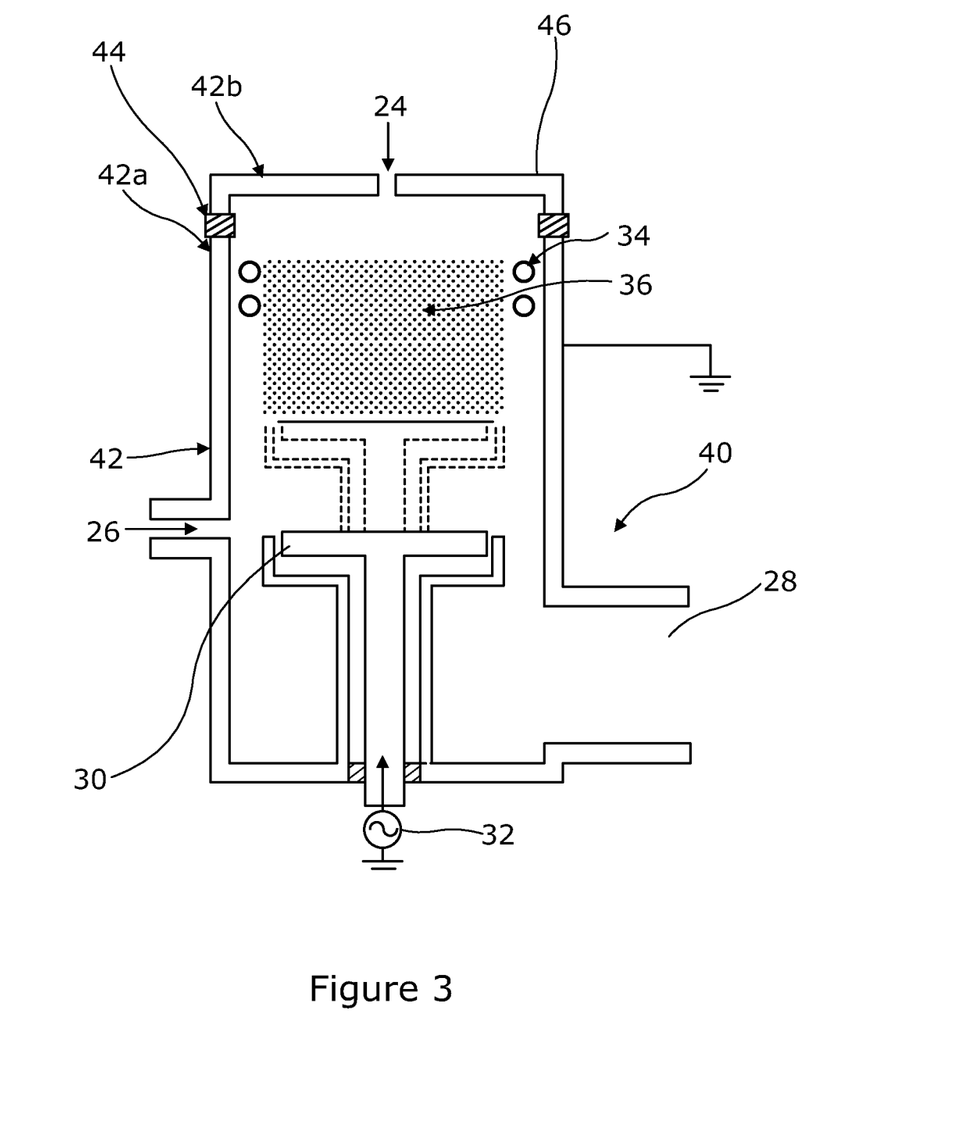
FIG. 3 is a cut away view of a second embodiment of a plasma etching apparatus.

FIG. 3 shows a second embodiment of a plasma etching apparatus, depicted generally at 40. The apparatus 40 comprises a number of features which are identical to corresponding features in the first embodiment shown in FIG. 2. Identical reference numerals are used to denote such identical features. The principal difference is that the chamber 40 is provided in two parts. More particularly, the chamber 42 comprises a main body portion 42a and a lid 42b. In use, the lid 42b is connected to a top portion of the main body portion 42a through a connector piece 44 which is formed from an insulating material. The connector piece 44 ensures that the lid 42 is electrically insulated from the main body portion 42a. The main chamber body portion 42a is electrically grounded. The electrical state of the lid 42b can be set using an electrical connection 46. The electrical state of the lid 42b may or may not be identical to the electrical state of the main body portion 42a. In other words, the lid 42b may or may not be electrically grounded.

It is particularly advantageous if the lid 42b is formed from a material which can be sputtered, such as the materials described above with reference to the coil 34. In this way, it is possible to sputter material from the lid 42b onto the walls of the main body portion 42a to provide a cleaning function. When the apparatus is operated in this way, it is highly advantageous for the electrical connection 46 to permit an electrical bias to be applied to the lid 42b from a suitable electrical power supply (not shown). A negative DC power supply is suitable for these purposes. When the lid 42b is biased by the negative DC power supply, ions from the plasma will bombard the lid 42b which acts as a cathode. This results in material being ejected from the lid 42b and coating the internal components of the chamber 42. An Argon based plasma is a suitable choice, which results in bombardment of the lid 42b by Argon ions. However, the invention is not limited in this regard. The cleaning functions performed by the sputtering of material of the lid 42b can be as described previously in relation to the coil 34. Thus, coating of the chamber walls with sputtered material can be used to effectively retain particulate material in place. This can significantly extend the interval period between maintenance procedures. Another possibility is for a getter material to be used in the lid 42*b*. In this way gaseous by-products can be removed from the atmosphere within the process chamber, as described above.

The primary purpose of the apparatus 20, 40 shown in FIGS. 2 and 3 is to act as pre-clean modules. This is done by performing a sputter etch process to remove material from the surface of the workpiece. An Argon plasma 36 may be used for this sputter etch process. It is noted that during the sputter etch process, sputtering of the coil 34 and/or the lid 42*b* is minimised to avoid contamination of the part being sputter etched. At desired times, the sputter etch process is halted, and the chamber itself is cleaned using sputtering of material from the coil 34 and/or the lid 42*b* onto the walls of the chamber 20, 40. With reference to the second embodiment shown in FIG. 3, it is desirable that the negative DC power is supplied to the lid 42*b* only during the period when sputtering of the lid 42*b* is performed. At other times, it is desirable for the lid 42*b* to be in another electrical state. In particular, it can be desirable to ground the lid 42*b* during the sputter etching of workpieces. Alternatively or additionally, it can be desirable to have the ability to allow the lid 42*b* to electrically float. Therefore, it is advantageous if the electrical connection 46 is configured so as to permit switching in the desired electrical state of the lid 42*b*.

With reference to both of the embodiments shown in FIGS. 2 and 3, it is generally necessary to provide some form of protection of the platen during the sputtering of the coil 34 and/or lid 42*b*. In the embodiments shown in FIGS. 2 and 3, this can be conveniently achieved by using the wafer loading slot 26 and the associated wafer handling system to position a dummy wafer over the platen 30 prior to commencement of the sputtering of the coil 34 and/or lid 42*b*. Alternatively, a dedicated platen protection system may be provided. For example, the platen 30 might be covered by a protective element which might be stored within the chamber and moved into position over the platen 30 prior to commencement of the sputtering process. A shutter system might be used to protect the platen during the sputtering process.

Figure 4:
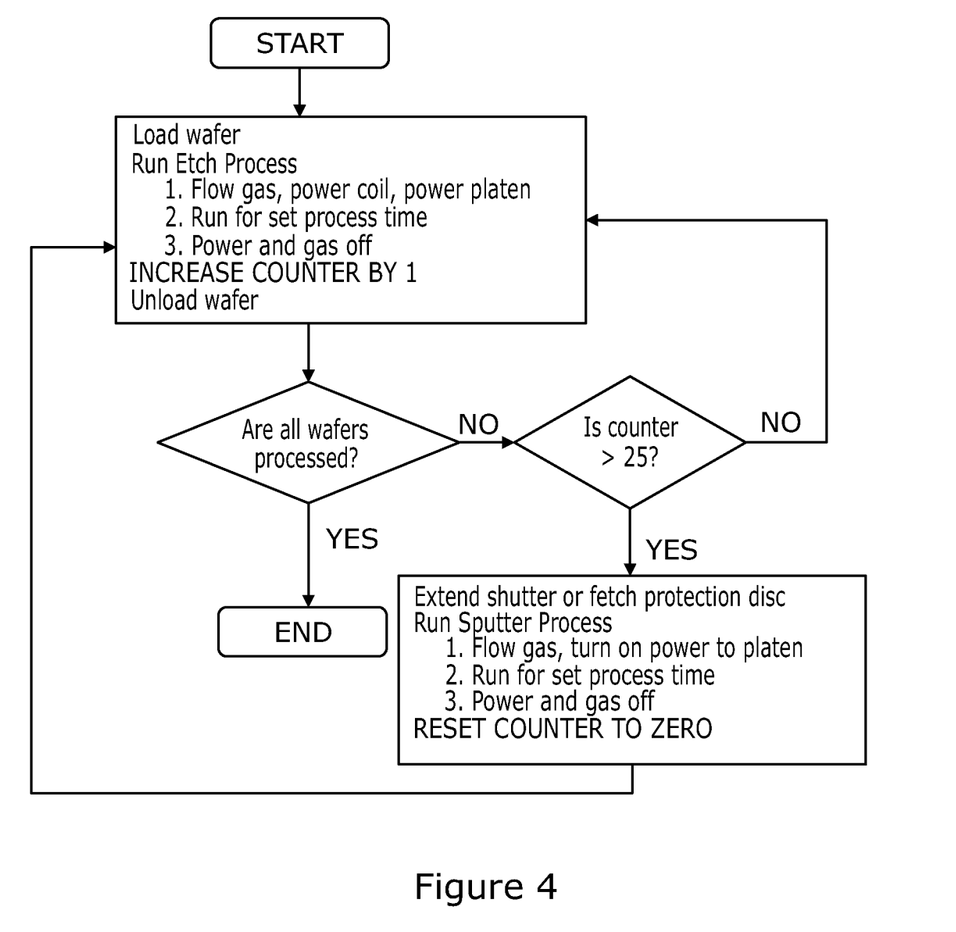
FIG. 4 is a flow diagram showing a process of the invention.

FIG. 4 is a flow chart which shows one way in which the invention can be implemented. In the process shown in FIG. 4, a sputtering process is run to perform a chamber cleaning function after 25 wafers have been etched. However, the interval between sputtering can be set as appropriate depending on the materials involved and the particle levels which are considered acceptable. The exemplar process shown in FIG. 4 includes sputtering step for cleaning the chamber in which RF power is supplied to the platen 30. It is also possible to provide sputtering by supplying RF power to the coil only, or to supply RF power to both the coil and the platen.

Although the invention has been exemplified in FIGS. 2 and 3 with reference to apparatus which are used to remove material by sputter etching, the invention extends also to other forms of etching. Also, the invention can be applied to the etching of various substrates. A particular advantage is that it is possible to etch otherwise problematic substrates whilst maintaining low particle levels and high vacuum levels. Numerous further variations will occur to the skilled reader which are within the ambit of the invention. For example, the coil and the lid may be formed from the same sputterable material. However, it is also possible for the coil and lid to be made from different materials. In this way advantageous effects associated with different materials can be enjoyed within a single sputtering process. For example, it is possible to optimise the effects of coating and gettering by using a coating material and a getter material. Thus, the coil may be formed from titanium and the lid may be formed from aluminium or vice versa. With sputter etching, metal layers which are subsequently deposited onto to the workpiece form contacts with lower resistance. Also, substrate particle density is reduced, which results in a higher functional die yield. Additionally, the time between chamber maintenance can be extended, which results in improved tool uptime and reduced cost of ownership.

What is claimed is:

1. A plasma etching apparatus for etching a substrate comprising:
    a chamber having a main body portion including a bottom wall and a side wall extending upright on the bottom wall, and a ceiling extending over a top of the main body portion;
    a gas inlet configured to supply an process gas into the chamber;
    a substrate support extending in the chamber from the bottom wall of the main body portion of the chamber and having an upper surface, dedicated to receive a substrate to plasma etched, in a first interior region delimited by an interior surface of the side wall of the main body portion of the chamber; and
    a plasma production device including an electrically conductive coil comprising a metallic material, the coil configured to produce a plasma in the process gas in the chamber in a first operational mode for etching the substrate, and to sputter the metallic material on the interior surface of the side wall of the main body portion of the chamber in a second operational mode for maintaining a cleanliness of the interior surface, wherein the coil is further configured to minimize sputtering of the metallic material in the first operational mode;
    in which the side wall of the main body portion of the chamber has a wafer loading slot extending radially therethrough at a lower part of the main body portion and through which a substrate to be plasma etched is introduced into the chamber and onto the upper surface of the substrate support,
    the coil is within an upper part of the main body portion of the chamber above the wafer loading slot,
    the coil is disposed in a second interior region delimited by the interior surface of the side wall of the main body portion of the chamber,
    the coil faces and is exposed, in a radially outwardly direction of the coil, to the interior surface of the side wall of the main body portion of the chamber, and
    the interior surface of the side wall extends vertically between the second interior region circumjacent the coil and the first interior region circumjacent the upper surface of the substrate support.

2. A plasma etching apparatus according to claim 1 in which the coil is configured such that the metallic material is sputtered to adhere particulate material to the interior surface of the side wall of the main body portion of the chamber.

3. A plasma etching apparatus according to claim 2 in which the metallic material is aluminium, an aluminium alloy, or copper.

4. A plasma etching apparatus according to claim 1 in which the metallic material is a getter material.

5. A plasma etching apparatus according to claim 4 in which the getter material is titanium, tantalum or tungsten.

6. A plasma etching apparatus according to claim 1 further comprising a device for covering the substrate support during the second operational mode and uncovering the substrate support after said second operational mode.

7. A plasma etching apparatus according to claim 6 in which the device comprises a cover and a moveable element to which the cover is connected and housed within the chamber.

8. A plasma etching apparatus according to claim 6 in which the device further comprises a substrate transfer system and a dummy substrate which is transported into and out of contact with the upper surface of the substrate support by the substrate transfer system.

9. A plasma etching apparatus according to claim 1 in which the ceiling of the chamber comprises a lid which covers and is electrically isolated from the main body portion of the chamber.

10. A plasma etching apparatus according to claim 9 in which the lid comprises a metallic material and is configured to sputter the metallic material from the lid onto the interior surface of the side wall of the main body portion of the chamber in the second operational mode.

11. A plasma etching apparatus according to claim 10 in which the metallic material of the lid is sputtered in the second operation so as to adhere particulate material to the interior surface of the side wall of the main body portion of the chamber.

12. A plasma etching apparatus according to claim 11 in which the metallic material of the lid is aluminium, an aluminium alloy, or copper.

13. A plasma etching apparatus according to claim 10 in which the metallic material of the lid is a getter material.

14. A plasma etching apparatus according to claim 13 in which the metallic material of the lid is titanium, tantalum or tungsten.

15. A plasma etching apparatus according to claim 10 comprising a lid electrical power supply configured to supply electrical power to the lid to enable sputtering of the metallic material from the lid in the second operational mode, and to not supply the electrical power to the lid in the first operational mode.

16. A plasma etching apparatus according to claim 15 in which the lid electrical power supply supplies negative DC electrical power to the lid in the second operational mode.

17. A plasma etching apparatus according to claim 15 further comprising a switching device for switching the lid between an electrical connection with the lid electrical power supply in the second operational mode and at least one other electrical state in the first operational mode.

18. A plasma etching apparatus according to claim 17 in which the other electrical state is a ground state or an electrically floating state.

19. A plasma etching apparatus according to claim 1 in which the walls of the main body portion of the chamber are of electrically conductive material.

20. A plasma etching apparatus according to claim 1 further comprising a controller which is operable to switch the apparatus between the first operational mode and the second operational mode.

21. A plasma etching apparatus according to claim 1 in which the plasma production device is an inductively coupled plasma production device and the coil is an inductive coil.

22. A plasma etching apparatus according to claim 1 further comprising an RF electrical power supply for supplying an RF bias power to the substrate support.

23. A multi-processing tool for processing a workpiece comprising a plurality of processing modules, in which one of the modules is a pre-clean module comprising a plasma etching apparatus according to claim 1.

24. A plasma etching apparatus according to claim 1, wherein the substrate support is configured to be positionable at a first location in the first operational mode and at a second location in the second operational mode, wherein the first location is closer to the coil than the second location.

25. A plasma etch apparatus according to claim 1, wherein the gas inlet is located in the ceiling of the chamber.

* * * * *